United States Patent
Arai

(10) Patent No.: US 8,129,254 B2
(45) Date of Patent: Mar. 6, 2012

(54) SEMICONDUCTOR DEVICE AND MANUFACTURING METHOD THEREOF

(75) Inventor: Shinya Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 306 days.

(21) Appl. No.: 12/563,934

(22) Filed: Sep. 21, 2009

(65) Prior Publication Data

US 2010/0181682 A1  Jul. 22, 2010

(30) Foreign Application Priority Data

Jan. 20, 2009  (JP) .................................. 2009-010266

(51) Int. Cl.
*H01L 21/76*  (2006.01)

(52) U.S. Cl. ........................................................ 438/444

(58) Field of Classification Search .................. 438/444, 438/637, 677
See application file for complete search history.

(56) References Cited

U.S. PATENT DOCUMENTS

| | | | |
|---|---|---|---|
| 7,485,582 B2 | 2/2009 | Nguyen et al. | |
| 2005/0156285 A1 | 7/2005 | Gates et al. | |
| 2006/0270214 A1* | 11/2006 | Iba | 438/637 |
| 2007/0264820 A1 | 11/2007 | Liu et al. | |

OTHER PUBLICATIONS

Ahn, J. H. et al., "Integration of Low-k α-SiOC:H Dielectric with Cu Interconnects," Journal of the Korean Physical Society, vol. 14, No. pp. 422-426, (Oct. 2002).

Gross, T. S. et al., "Nanoscale Observation of Dielectric Damage to Low k-MSQ Interconnects from Reactive ion Etching and Ash Treatment," Mater. Res. Soc. Symp. Proc., Materials Research Society B2.4, vol. 863, pp. 165-169, (2005).

Bhanap, A. et al., "Repairing Process-Induced Damage to Porous Low-k ILDS by Post-Ash Treatment," Conference Proceedings AMC XIX, Materials Research Society, pp. 519-523, (2004).

* cited by examiner

*Primary Examiner* — Jenny L Wagner

(74) *Attorney, Agent, or Firm* — Finnegan, Henderson, Farabow, Garrett & Dunner, L.L.P.

(57) ABSTRACT

A method of manufacturing a semiconductor device, includes forming an insulating film of a material having a low relative dielectric constant on a substrate, forming an SiOCH film on the insulating film in a chamber, forming an $SiO_2$ film continuously on the SiOCH film by reducing a carbon concentration therein in the chamber in which plasma is being generated, performing a plasma etching on the insulating film by using the SiOCH film and the $SiO_2$ film as a hardmask layer, to form a trench in the insulating film, and performing wet etching on a surface of the trench formed in the insulating film, to remove a layer damaged by the plasma etching and process residues.

16 Claims, 10 Drawing Sheets

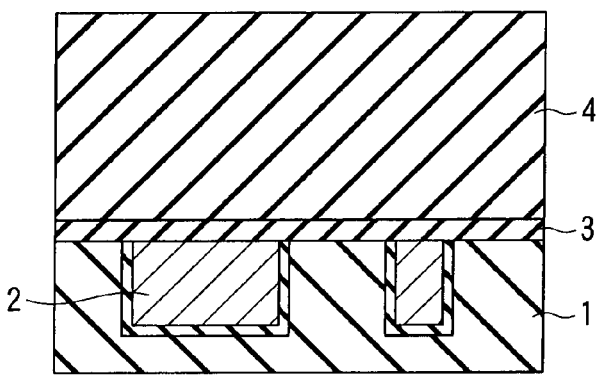
F I G. 2
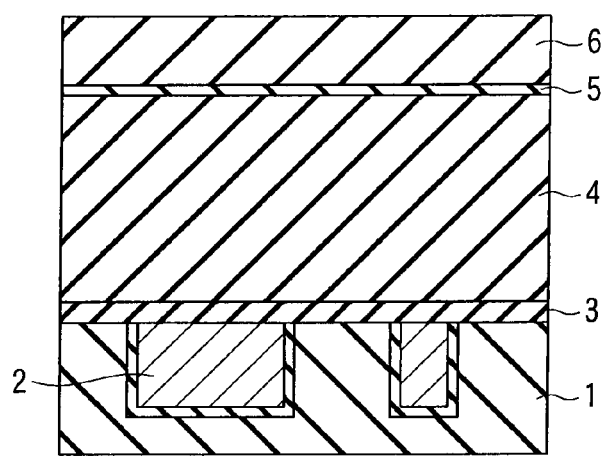
F I G. 3
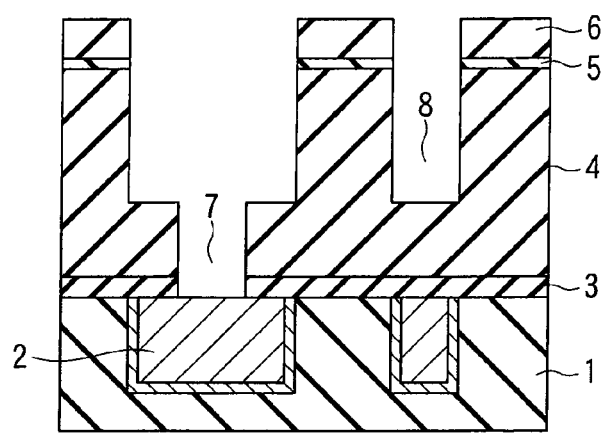
F I G. 4

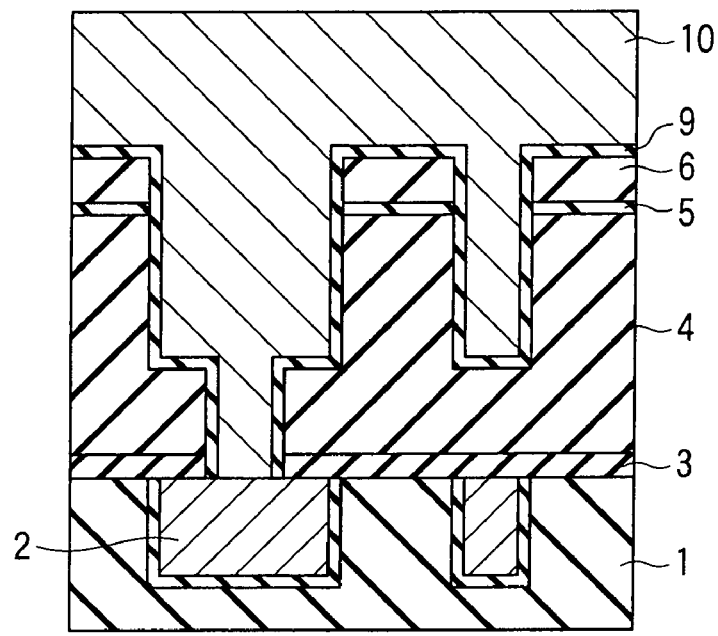
F I G. 5
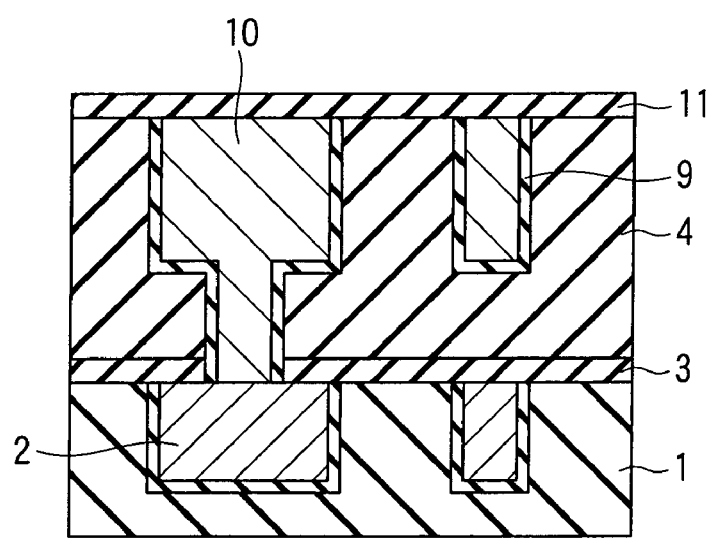
F I G. 6

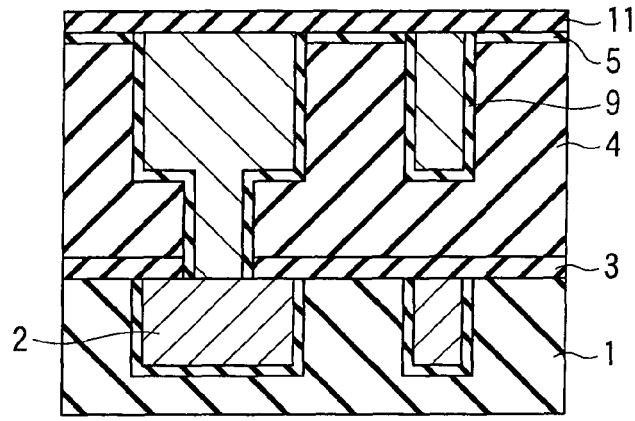
F I G. 9
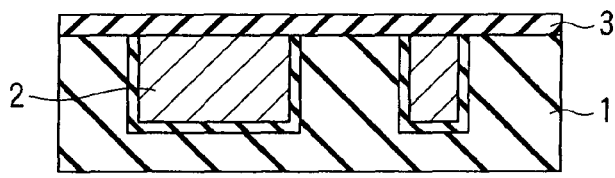
F I G. 10
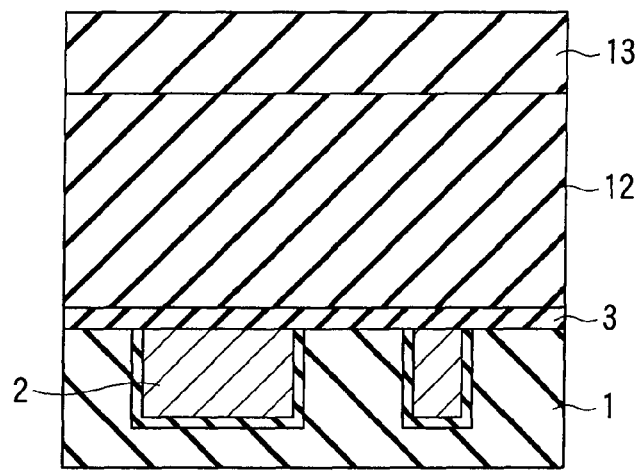
F I G. 11

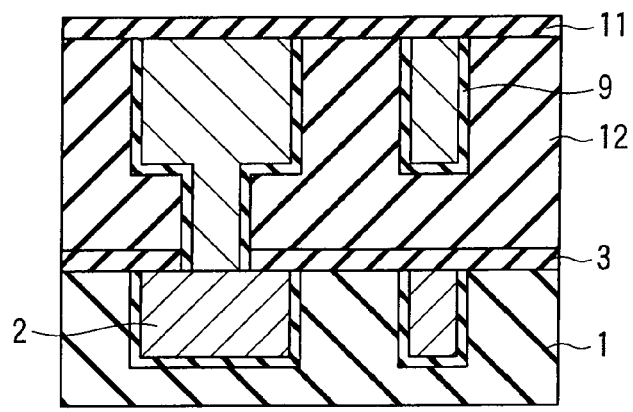
F I G. 14
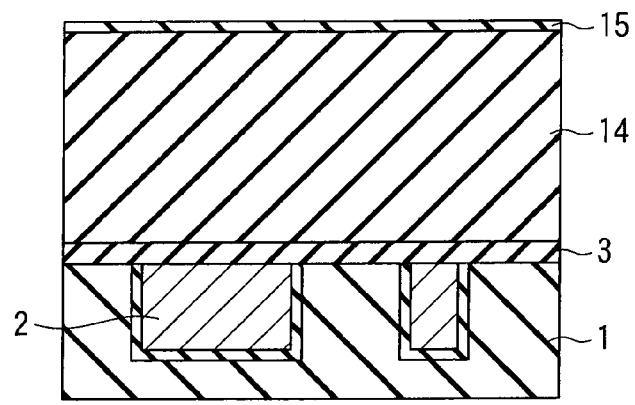
F I G. 15
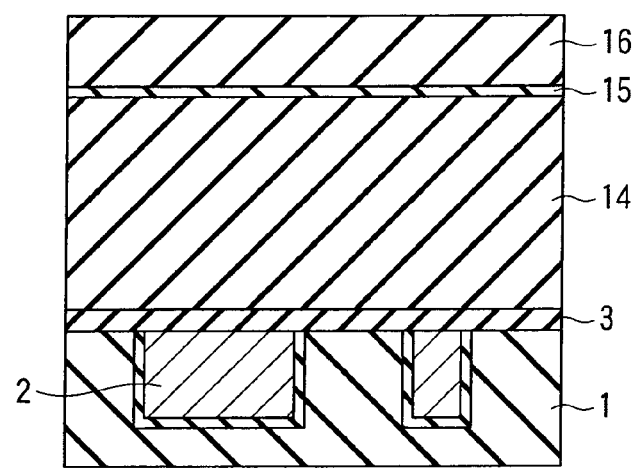
F I G. 16

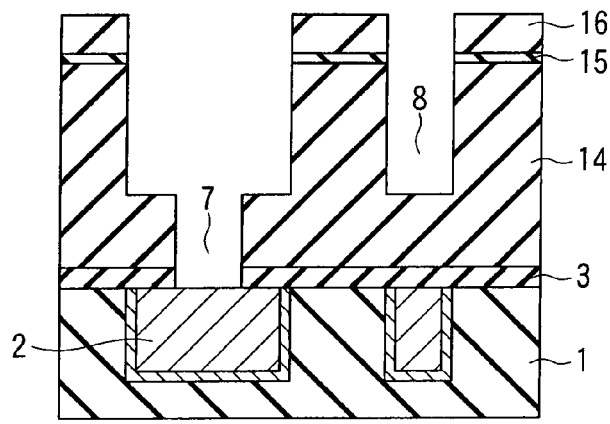
F I G. 17
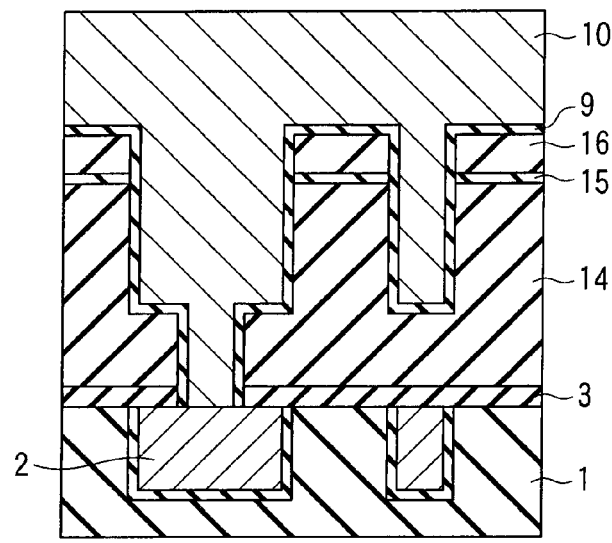
F I G. 18
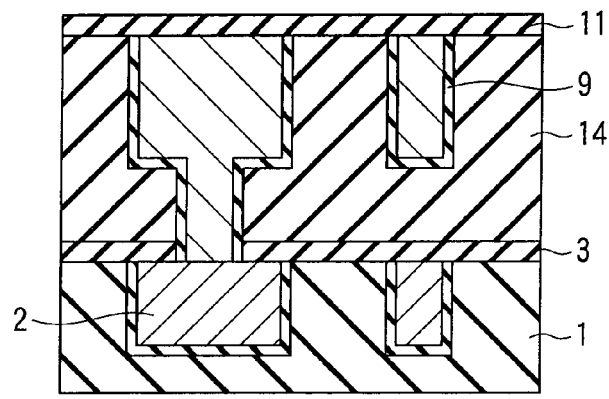
F I G. 19

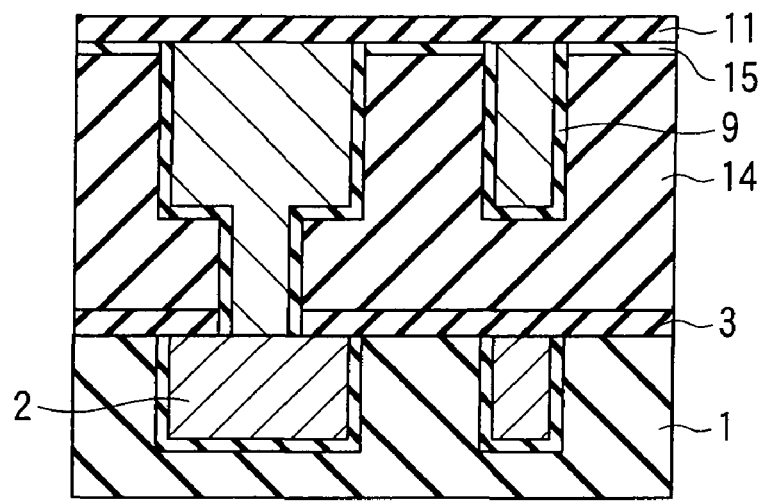
F I G. 20
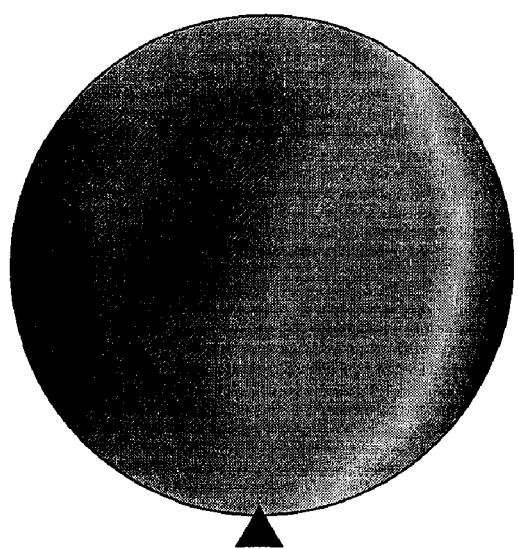
82.022　　　　　170.45
Ave.=106Å
Center=101Å
F I G. 21

SEMICONDUCTOR DEVICE AND MANUFACTURING METHOD THEREOF

CROSS-REFERENCE TO RELATED APPLICATIONS

This application is based upon and claims the benefit of priority from prior Japanese patent application No. 2009-010266, filed Jan. 20, 2009, the entire contents of which are incorporated herein by reference.

BACKGROUND OF THE INVENTION

1. Field of the Invention

The present invention relates to a semiconductor device and a manufacturing method thereof, and more specifically to an interconnect technology incorporating a low-k film, which is an interlayer insulating film of a low relative dielectric constant.

2. Description of the Related Art

As the packing density of a semiconductor device is increased, the width and thickness of interconnect layers become smaller, and the spacing between the interconnect layers becomes smaller. This increases signal delay times. A delay time is determined by a parasitic resistance R and a parasitic capacitance C of interconnects. Basically, as the interconnects become finer, both the parasitic resistance R and the parasitic capacitance C increase. The parasitic resistance R can be reduced by adopting a low-resistance material such as copper for an interconnect material (Cu interconnects). On the other hand, the parasitic capacitance C decreases as the effective dielectric constant keff of the interlayer insulating film deposited between the interconnects is reduced. In other words, the parasitic capacitance C can be reduced by the interlayer insulating film having a lower relative dielectric constant k, and therefore an interlayer insulating film having a low relative dielectric constant (k is 3.0 or less), called a low-k film, has been employed.

However, when interconnect trenches are formed in a low-k film by plasma treatment (for hardmask layer formation and RIE), a reaction occurs between oxygen utilized in the treatment and carbon. Due to this reaction, carbon escapes from the low-k film, producing a "damaged layer" on the surface of the low-k film (see, for example, Jeong-Hoon Ahn, "Integration of a low-k α-SiOC:H dielectric with Cu interconnects", Journal of the Korean Physical Society (South Korea) Vol. 41, No. 4, October 2002, pp. 422-426; Gross, T. S., "Nanoscale observation of dielectric damage to low k MSQ interconnects", Materials, Technology and Reliability of Advanced Interconnects—2005, Symposium (Materials Research Society Proceedings, Vol. 863) xiii+411, pp. 165-169 2005; and Bhanap. A, "Repairing process-induced damage to porous low-k ILDs by post-ash treatment", Advanced Metallization Conference 2003 xxiii+792 pp. 519-523 2004). The damaged layer, which has a high relative dielectric constant, increases the capacitance between the interconnects. Furthermore, because the damaged layer can easily absorb moisture, the barrier metal and Cu interconnects tend to undergo oxidation, which reduces the reliability of the interconnects. In order to avoid such problems, the damaged layer is removed with a hydrofluoric acid solution after the interconnect trench formation. This wet etching treatment using the solution is performed also to remove process residues on the lower interconnect at the bottom of the via. Without this treatment, conduction defects would occur between the via and the lower interconnect.

However, the wet etching of the damaged layer proceeds more quickly than the etching of hardmask layer. For this reason, undercuts are created in the low-k film beneath the hardmask layer HM ($SiO_2$ film in this example), as shown in FIGS. 1A and 1B (see the area [HM undercut] circled in FIG. 1B). The overhang portions formed by these undercuts lead to defects caused by insufficient embedment of interconnect metal into the interconnect trenches. Hence, the defects in the embedment may occur along the interconnect trenches as indicated by white streaks in FIG. 1C, and voids appear as indicated by blackened areas disturbing the patterns in the lower left corner of the drawing.

BRIEF SUMMARY OF THE INVENTION

According to a first aspect of the present invention, there is provided a method of manufacturing a semiconductor device, comprising: forming an insulating film of a material having a low relative dielectric constant on a substrate; forming a silicon oxycarbide (SiOCH) film on the insulating film in a chamber; forming a silicon dioxide ($SiO_2$) film continuously on the SiOCH film by reducing a carbon concentration therein in the chamber in which plasma is being generated; performing a plasma etching on the insulating film by using the SiOCH film and the $SiO_2$ film as a hardmask layer, to form a trench in the insulating film; and performing wet etching on a surface of the trench formed in the insulating film, to remove a layer damaged by the plasma etching and process residues.

According to a second aspect of the present invention, there is provided a method of manufacturing a semiconductor device, comprising: forming a SiOCH film on a substrate in a chamber; forming a $SiO_2$ film continuously on the SiOCH film by reducing a carbon concentration therein in the chamber in which plasma is being generated; performing a plasma etching on the SiOCH film by using the $SiO_2$ film as a hardmask layer, to form a trench in the SiOCH film; and performing wet etching on a surface of the trench formed in the SiOCH film, to remove a layer damaged by the plasma etching and process residues.

According to a third aspect of the present invention, there is provided a method of manufacturing a semiconductor device, comprising: forming a SiOCH film on a substrate; forming, on the SiOCH film, a dense layer having a density higher than a density of the SiOCH film and a carbon concentration higher than a carbon concentration of the SiOCH film; forming a hardmask layer on the dense layer; performing a plasma etching on the dense layer and the SiOCH film by using the hardmask layer as a mask to form a trench in the dense layer and the SiOCH film; and performing wet etching on a surface of the trench formed in the SiOCH film, to remove a layer damaged by the plasma etching and process residues.

According to a fourth aspect of the present invention, there is provided a semiconductor device comprising: an insulating film of a material having a low relative dielectric constant; a SiOCH film formed on the insulating film, having a carbon concentration higher than a carbon concentration of the insulating film; a trench formed in the SiOCH film and the insulating film; a first barrier layer formed on an inside surface of the trench; a conductive layer filling the trench; and a second barrier layer formed on the SiOCH film and the conductive layer.

According to a fifth aspect of the present invention, there is provided a semiconductor device comprising: a SiOCH film formed on an insulating film; a dense layer formed on the SiOCH film, having a density higher than a density of the SiOCH film and a carbon concentration higher than a carbon concentration of the SiOCH film; a trench formed in the dense layer and the SiOCH film; a first barrier layer formed on an inside surface of the trench; a conductive layer filling the trench; and a second barrier layer formed on the dense layer and the conductive layer.

BRIEF DESCRIPTION OF THE SEVERAL VIEWS OF THE DRAWING

FIG. 2 is a diagram for explaining a method of manufacturing a semiconductor device according to the first embodiment of the present invention, showing a cross section of a structure in which an upper interlayer insulating film is deposited after a lower interconnect layer is formed.

FIG. 3 is a diagram for explaining the method of manufacturing the semiconductor device according to the first embodiment of the present invention, showing a cross section of a structure in which a SiOCH film and a $SiO_2$ film are continuously formed to serve as a hardmask layer on the interlayer insulating film.

FIG. 4 is a diagram for explaining the method of manufacturing the semiconductor device according to the first embodiment of the present invention, showing a cross section of a structure in which an interconnect trench pattern and a via pattern are formed in the upper insulating film.

FIG. 5 is a diagram for explaining the method of manufacturing the semiconductor device according to the first embodiment of the present invention, showing a cross section in which the interconnect trench pattern and the via pattern are filled with a barrier metal and Cu.

FIG. 6 is a diagram for explaining the method of manufacturing the semiconductor device according to the first embodiment of the present invention, showing a structure from which the hardmask layer containing the SiOCH film and the $SiO_2$ film and an excess portion of the Cu film are removed.

FIG. 9 is a diagram for explaining a method of manufacturing a semiconductor device according to a modified example of the first embodiment of the present invention, showing a cross section of a structure in which the $SiO_2$ film, which is part of a hardmask layer, and an excess portion of a Cu film have been removed.

FIG. 10 is a diagram for explaining a method of manufacturing a semiconductor device according to the second embodiment of the present invention, showing a cross section of a structure in which a Cu diffusion barrier layer is deposited after the lower interconnect layer is formed.

FIG. 11 is a diagram for explaining the method of manufacturing the semiconductor device according to the second embodiment of the present invention, showing a cross section of a structure in which an interlayer insulating film and a hardmask layer are continuously formed on the Cu diffusion barrier layer.

FIG. 14 is a diagram for explaining the method of manufacturing the semiconductor device according to the second embodiment of the present invention, showing a cross section of a structure from which the hardmask layer and an excess portion of the Cu film are removed.

FIG. 15 is a diagram for explaining the method of manufacturing the semiconductor device according to the second embodiment of the present invention, showing a cross section of a structure in which an upper interlayer insulating film is deposited and a dense layer is deposited on the surface of the film after the lower interconnect layer is formed.

FIG. 16 is a diagram for explaining the method of manufacturing the semiconductor device according to the third embodiment of the present invention, showing a cross section of a structure in which a hardmask layer is formed on interlayer insulating film.

FIG. 17 is a diagram for explaining the method of manufacturing the semiconductor device according to the third embodiment of the present invention, showing a cross section of a structure in which an interconnect trench pattern and a via pattern are formed in the upper insulating film.

FIG. 18 is a diagram for explaining the method of manufacturing the semiconductor device according to the third embodiment of the present invention, showing a cross section in which the interconnect trench pattern and the via pattern are filled with a barrier metal and Cu.

FIG. 19 is a diagram for explaining the method of manufacturing the semiconductor device according to the third embodiment of the present invention, showing a cross section of a structure from which the hardmask layer, the dense layer on the interlayer insulating film, and an excess portion of the Cu film are removed.

FIG. 20 is a diagram for explaining a modified example of the third embodiment of the present invention, showing a cross section of a structure from which a hardmask layer and an excess portion of a Cu film are removed.

FIG. 21 is a diagram showing optical measurement results of a thickness of the dense layer deposited on the interlayer insulating film with the method of manufacturing the semiconductor device according to the third embodiment of the present invention.

DETAILED DESCRIPTION OF THE INVENTION

Figure 1C:
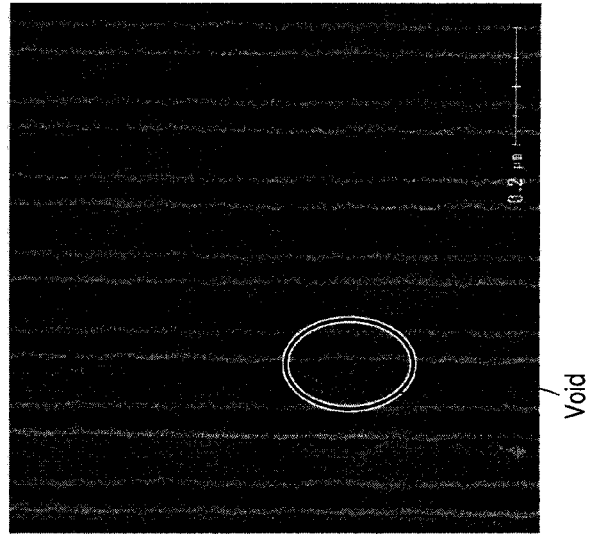
FIG. 1C is a scanning electron microscope (SEM) photograph showing the CMP-planarized surface of the semiconductor device after the embedment of the metal in the interconnect trenches.

According to the first to third embodiments of the present invention, the following three manufacturing methods, (1), (2) and (3), are suggested as a means of preventing undercuts from being created beneath hardmask layer after the treatment of a low-k film.

(1) C-Concentration Gradient Hardmask Layer

The first embodiment suggests a method of depositing a hardmask layer formed of a $SiO_2$ film on a low-k film, in which a SiOCH film is deposited as an initial film and then the concentration of carbon (C) is gradually reduced so that the $SiO_2$ film can be continuously formed. By providing the SiOCH as the initial film, damage to the low-k film can be suppressed.

(2) Single Deposition Process of Low-k Film to Hardmask Layer

The second embodiment suggests a method with which a low-k film is formed, and then the C concentration is gradually reduced so as to continuously form a hardmask layer of a $SiO_2$ film. The process of the low-k film formation through the $SiO_2$ film (hardmask layer) deposition is performed in a single process, without shutting down the plasma.

(3) Formation of Dense Layer on Low-k Film

The third embodiment suggests a method of forming a dense layer having a high C concentration on the surface of the low-k film in order to reduce the plasma damage when depositing a hardmask layer on the low-k film.

According to the manufacturing methods (1) to (3), the low-k film adopted for an interlayer insulating film in a semiconductor device is subjected to less damage during plasma etching for formation of interconnect trenches. Then, the creation of undercuts at the step of removal of a damaged layer is suppressed and the defects in embedment of interconnect metal is avoided.

The first to third embodiments of the present invention will be explained below, with reference to the attached drawings.

Embodiment 1

FIGS. 2 to 6 are presented to explain a semiconductor device and a manufacturing method thereof according to the first embodiment of the present invention, showing cross sections of a structure at different production steps in due order. The present embodiment focuses on a fabrication process of a dual damascene structure; and therefore, the production of a device on a semiconductor substrate and the process after the interconnect formation are omitted here.

First, as illustrated in FIG. 2, interconnect trenches are formed in a surface area of an insulating film (lower insulating film) 1 that is deposited on a semiconductor substrate. After forming a Cu barrier layer, if necessary, on an inside surface of the interconnect trenches, a Cu interconnect (conductive layer) 2 is embedded as a lower interconnect layer in the interconnect trenches. Thereafter, a Cu diffusion barrier layer (first insulating film) 3, such as a SiC film, is formed on the insulating film 1 and the Cu interconnect 2. This SiC film is used as an etching stopper and also for prevention of Cu diffusion. An upper insulating film (second insulating film) 4, such as a SiOCH film, is formed on the first insulating film 3. The SiOCH film is a low-k film, having a relative dielectric constant of 3.0 or less.

Next, as indicated in FIG. 3, the SiOCH film 5 is formed immediately above the second insulating film 4, and then a $SiO_2$ film 6 is continuously formed in such a manner as to have a carbon (C) concentration gradient by reducing the carbon concentration of the film inside a chamber in which plasma is being generated. The SiOCH film 5 and the $SiO_2$ film 6 function together as a hardmask layer. For the gas source of this hardmask layer, an alkyl silane gas, for example, at least any one of diethoxymethyl silane (DEMS), octamethyl cyclotetrasiloxane (OMCTS), tetramethyl cyclotetrasiloxane (TMCTS), trimethyl silane (TMS) and dimethyldimethoxy silane (DMDMOS) is incorporated.

In the continuous formation of the SiOCH film 5 and the $SiO_2$ film 6, the C concentration is reduced, for example, by gradually increasing the flow rate of oxygen in the reaction gas. More specifically, the flow rate is increased from 0 standard L/min (slm) to 1 slm in 3 seconds.

The SiOCH film 5 is provided in order to minimize damage to the second insulating film 4 when depositing the $SiO_2$ film thereon. If the $SiO_2$ film is formed directly on the second insulating film 4, undercuts may be created beneath the hardmask layer during a wet etching process which is performed after the formation of the interconnect trenches, which may lead to lift-off of the hardmask layer.

Preferably, the thickness of the SiOCH film 5 is within a range of 1 to 100 nm according to the current design rule. The etching rate of the $SiO_2$ film 6 in a hydrofluoric acid treatment should be 2 to 10 times as high as that of a thermally oxidized film.

Next, as illustrated in FIG. 4, a stacked film of the SiOCH film 5 and the $SiO_2$ film 6 is patterned using the patterned stacked film as a hardmask, a plasma etching is performed on the second insulating film 4 and the first insulating film 3 to form a via pattern 7. Then the stacked film of the SiOCH film 5 and the $SiO_2$ film 6 is patterned using the patterned stacked film as a hardmask, a plasma etching is performed on the second insulating film 4 to form an interconnect trench pattern 8. Thereafter, a wet etching is performed on surfaces of inner walls of the via pattern 7 and the interconnect trench pattern 8 to remove a damage layer and process residues due to the plasma etching.

In the above example, the dual damascene structure, which does not require many production steps for fabrication, is described, but the technique can be applied to a single damascene structure, in which a via pattern and an interconnect trench are separately formed. The same production steps for a conductive layer that is explained below are used for both structures.

As illustrated in FIG. 5, a Cu barrier layer 9 is formed on the $SiO_2$ film 6 and also to cover the inside surfaces of the via pattern 7 and the interconnect trench 8. Then, a Cu film 10 is deposited on the Cu barrier layer 9, for example, by electrolytic plating, so that Cu is filled in the via pattern 7 and the interconnect trench portion 8.

Next, as indicated in FIG. 6, an excess portion of the Cu film 10, part of the Cu barrier layer 9, and all of the $SiO_2$ film 6 and the SiOCH film 5 are removed by CMP. Thereafter, a third insulating film 11 is formed on the second insulating film 4 and the Cu film 10. The third insulating film 11 is formed of the same material as the first insulating film 3 such as SiC, to serve as an etching stopper and to prevent Cu from diffusing.

Preferably, the thickness of the SiOCH film 5 should be less than that of the $SiO_2$ film 6 because the CMP planarization characteristic of the SiOCH film 5 is not as good as that of the $SiO_2$ film 6. For example, when the total thickness of the $SiO_2$ film 6 and the SiOCH film 5 is 60 nm, the thickness of the SiOCH film 5 should be less than 30 nm. If the SiOCH film 5 is thicker than the $SiO_2$ film 6, the interconnect resistance may widely vary.

Figure 1A:
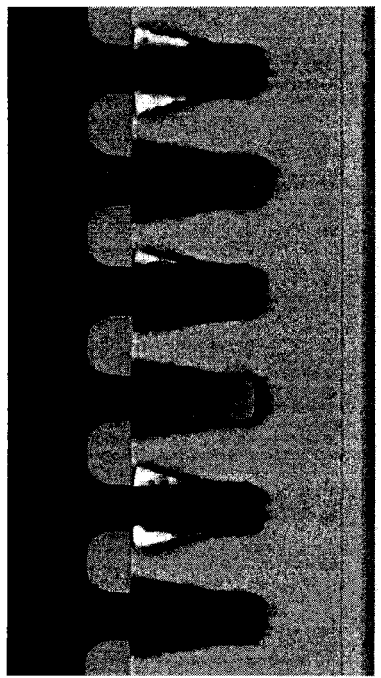
FIG. 1A is a transmission electron microscope (TEM) photograph showing a cross section of a prototype of a semiconductor device in which metal has been embedded in interconnect trenches.
Figure 1B:
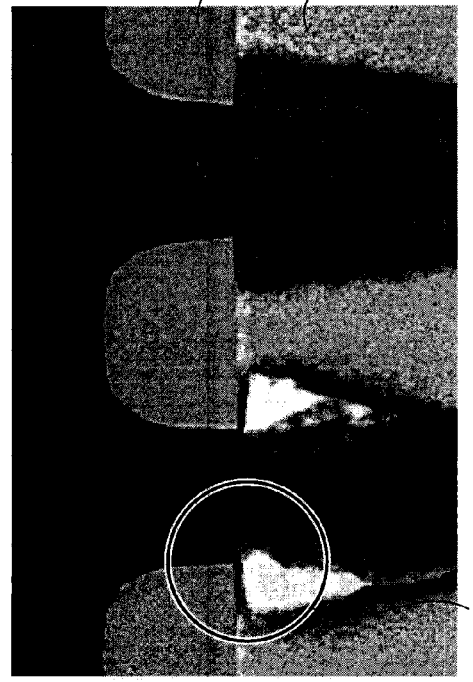
FIG. 1B is an enlarged view of the TEM photograph of FIG. 1A.
Figure 7:
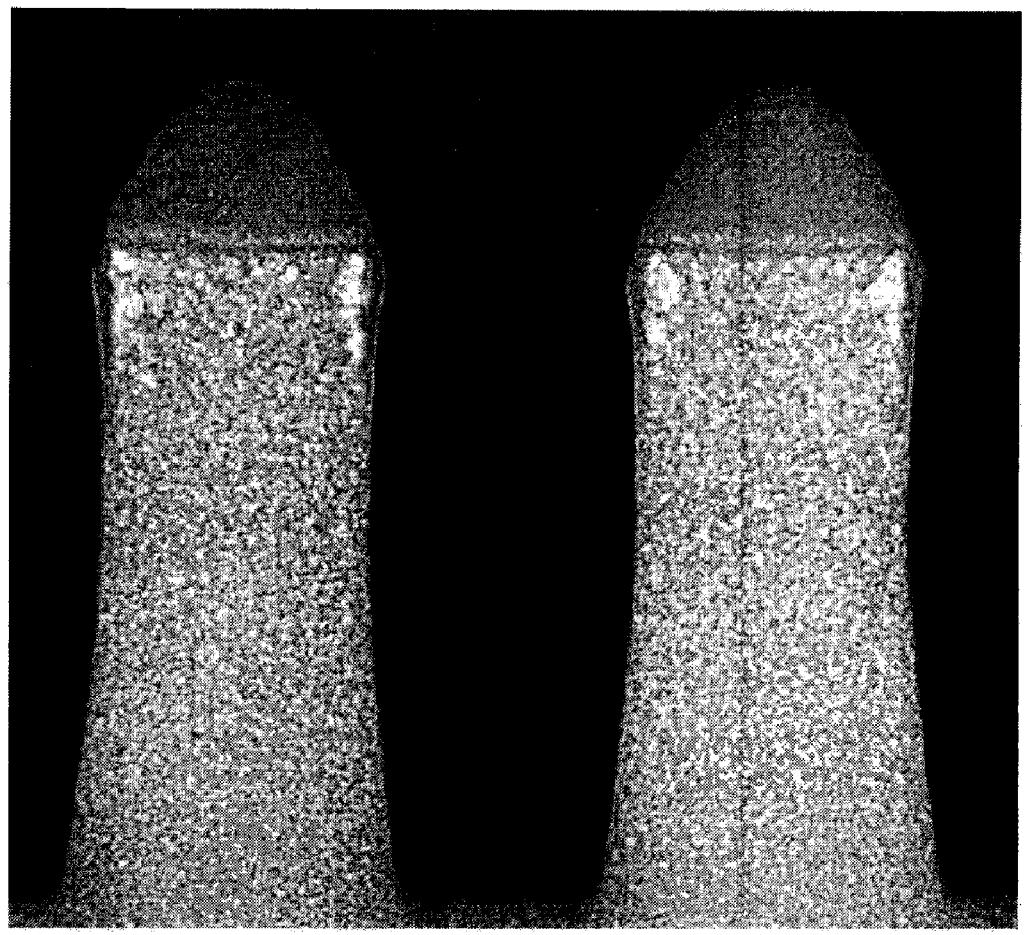
FIG. 7 is a TEM photograph showing a cross section of a structure fabricated with the method of manufacturing the semiconductor device according to the first embodiment of the present invention after the embedment of the interconnect metal.
Figure 8:
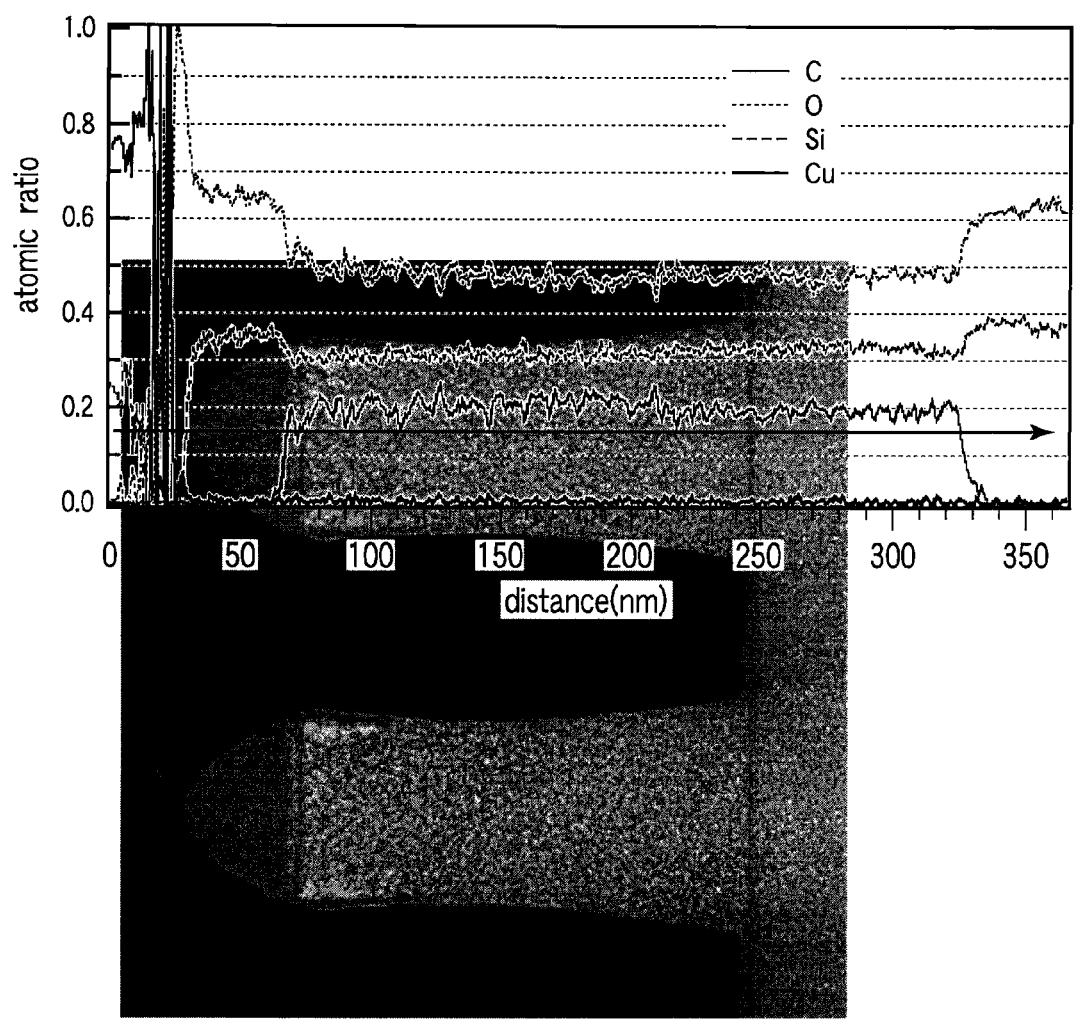
FIG. 8 is a diagram of an electron energy loss spectroscopy (EELS) profile overlaying the TEM photograph of FIG. 7.

FIG. 7 shows a cross-section TEM image before the CMP, while FIG. 8 shows EELS analysis results before the CMP. FIG. 7 is a cross-section TEM photograph of the structure fabricated with the semiconductor device manufacturing method according to the first embodiment, after the embedment of the interconnect metal. In FIG. 8, an EELS profile is overlaid with the cross-section TEM photograph of FIG. 7 after the embedment of the interconnect metal. As can be seen from the drawings, the thickness of the SiOCH film 5 is approximately 5 nm so as to be thinner than the $SiO_2$ film 6. From the EELS analysis results, the C concentration gradient region is approximately 5 nm. The structure is in good condition, free of undercuts as the ones formed beneath the hardmask layer illustrated in FIGS. 1A to 1C.

According to such structure and manufacturing method, in a semiconductor device adopting a low-k film for an interlayer insulating film, damage to the low-k film can be reduced during the formation of the interconnect trenches, and formation of undercuts can be suppressed. Defects in embedment of interconnect metal can be thereby reduced.

FIG. 9 is presented to explain a modified example of the semiconductor device manufacturing method according to the first embodiment of the present invention, showing a cross section of a structure after the removal of the $SiO_2$ film as part of the hardmask layer and an excess portion of the Cu film. Unlike the structure of FIG. 6, the SiOCH film 5 remains after the CMP in the structure of the modified example illustrated in FIG. 9. After the CMP, a third insulating film 11 is formed of SiC or the like on this SiOCH film 5 to serve as an etching stopper and to prevent Cu from diffusing.

After the third insulating film 11 is formed, the steps of FIGS. 2 through 6 are repeated as required so as to achieve multilayered interconnects.

By leaving the SiOCH film 5 on the second insulating film 4, the second insulating film 4 would not be exposed to an atmosphere of plasma when reducing oxides on the Cu interconnect so that an inter-interconnect time dependent dielectric breakdown (TDDB) strength is prevented from being reduced. In other words, the value k of the SiOCH film 5 is set higher than that of the second insulating film 4. The second insulating film 4 is thereby prevented from being exposed to the plasma atmosphere, for example, in a $NH_3$ plasma treatment that is generally conducted to reduce oxides on the Cu interconnect before the formation of the third insulating film 11. A methyl group near the surface of the second insulating film 4 can be thereby prevented from being detached, and creation of a damaged layer can be avoided. As a result, resistance properties to the plasma treatment can be improved, and the inter-interconnect TDDB strength can be maintained.

It should be noted; however, that the SiOCH film 5 would increase the inter-interconnect capacitance, and thus the structure of FIG. 6 or 9 should be selected in accordance with the specs required for a device.

Embodiment 2

FIGS. 10 to 14 are provided to explain a semiconductor device and a manufacturing method thereof according to the second embodiment of the present invention, showing cross sections obtained at different production steps in due order. In a similar manner to the first embodiment, fabrication of a dual damascene structure is focused on in the present embodiment, and thus the formation process of a device on the semiconductor substrate and the process after the formation of interconnects are omitted here.

First, interconnect trenches are formed in a surface area of an insulating film (lower insulating film) 1 that is provided on a semiconductor substrate, as indicated in FIG. 10. After forming a Cu barrier layer, if necessary, in an inside surface of interconnect trenches, a Cu interconnect 2 (conductive layer) is embedded in the interconnect trench and formed as a lower interconnect layer. Thereafter, a SiC film or the like is deposited as a Cu diffusion barrier layer (first insulating film) 3 on the insulating film 1 and the Cu interconnect 2.

Next, as illustrated in FIG. 11, a SiOCH film 12 or the like is formed as an upper insulating layer (second insulating film) on the first insulating film 3, and then the C concentration of the film is gradually reduced in a chamber in which plasma is being generated so that a $SiO_2$ film 13 is continuously formed to serve as a hardmask layer. The continuous formation of the SiOCH film 12 and the $SiO_2$ film 13 is the same as the formation of the C-concentration gradient hardmask layer according to the first embodiment. For example, a flow rate of oxygen in the reaction gas is gradually increased to reduce the C concentration. More specifically, in the same manner as in the first embodiment, the flow rate is increased from 0 standard L/min (slm) to 1 slm in 3 seconds.

As discussed above, damage to the second insulating film 12 can be reduced when forming the $SiO_2$ film 13 as the hardmask layer, by continuously forming the second insulating film 12 and the $SiO_2$ film 13.

Figure 12:
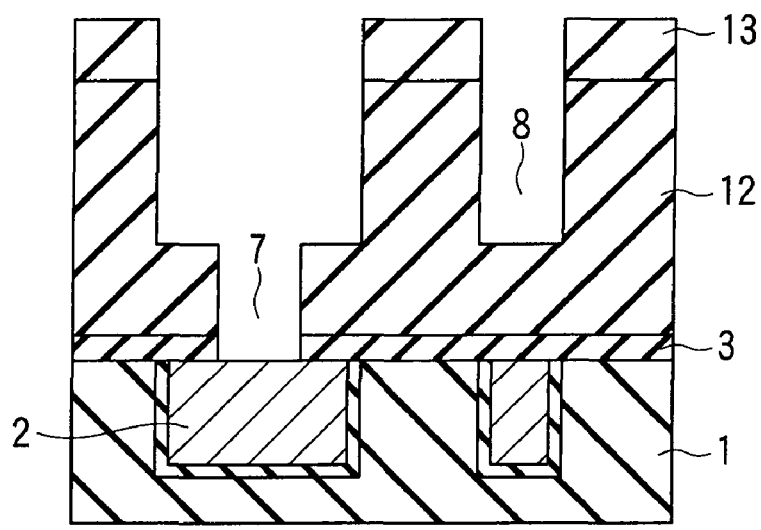
FIG. 12 is a diagram for explaining the method of manufacturing the semiconductor device according to the second embodiment of the present invention, showing a cross section of a structure in which an interconnect trench pattern and a via pattern are formed in the upper insulating film.
Figure 13:
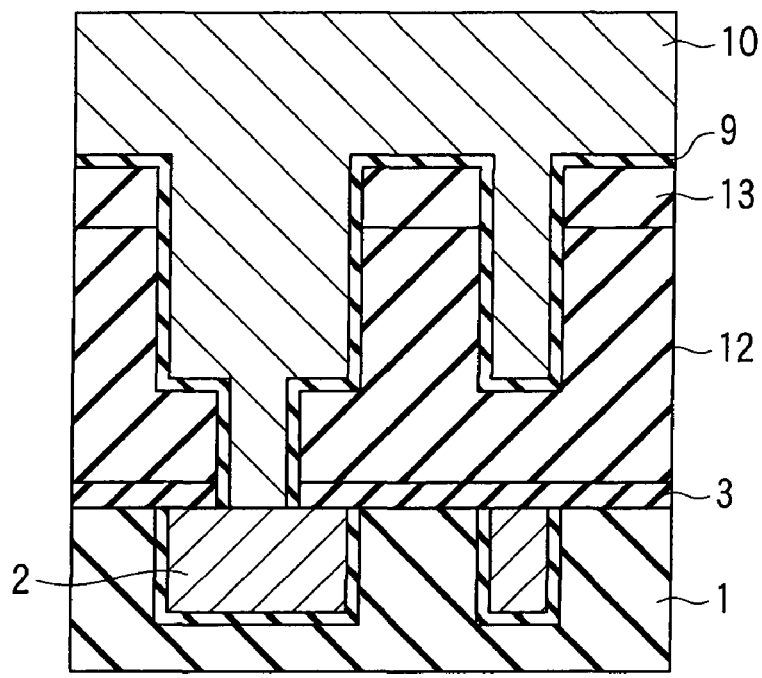
FIG. 13 is a diagram for explaining the method of manufacturing the semiconductor device according to the second embodiment of the present invention, showing a cross section of a structure in which the interconnect trench pattern and the via pattern are filled with a barrier metal and Cu.

The steps of FIGS. 12, 13 and 14 that follow the above process are the same as those of FIGS. 4, 5 and 6, and thus detailed explanations are omitted here.

According to the above structure and manufacturing method of a semiconductor device adopting a low-k film for an interlayer insulating film, damage to the low-k film can be minimized in the formation of the interconnect trenches so that creation of undercuts can be suppressed and defects in embedment of interconnect metal can be reduced.

Embodiment 3

FIGS. 15 to 20 are provided to explain a semiconductor device and a manufacturing method thereof according to the third embodiment of the present invention, showing cross sections obtained at different steps of the production in due order. Similarly to the first and second embodiments, the present embodiment focuses on the fabrication of a dual damascene structure; and therefore, the formation process of a device on a semiconductor substrate and the process after the formation of interconnects are omitted here.

First, as illustrated in FIG. 15, interconnect trenches are formed in a surface area of an insulating film (lower insulating film) 1 that is deposited on the semiconductor substrate. After forming a Cu barrier layer, if necessary, on an inside surface of interconnect trenches, a Cu interconnect (conductive layer) 2 is embedded in the interconnect trenches to form a lower interconnect layer. Thereafter, a SiC film or the like is formed on an insulating film 1 and the Cu interconnect 2, as a Cu diffusion barrier layer (first insulating film) 3. Next, a SiOCH film or the like is formed on a first insulating film 3 as an upper insulating film (second insulating film) 14, and then a SiOCH film (dense layer) 15 is continuously formed by gradually reducing the amount of porogen in the film inside a plasma generating chamber. The completed SiOCH film 15 does not contain any porogen.

Thereafter, the porogen is removed from the SiOCH film 14 by a curing process so as to obtain a porous film. Because porogen is not included in the SiOCH film 15 during the curing process, this film has a higher density than the SiOCH film 14. For this reason, the value k of the SiOCH film 15 is greater than that of the SiOCH film 14, which improves the damage resistance to the plasma. In addition, the SiOCH film 15 has a higher carbon concentration than the SiOCH film 14.

Next, as indicated in FIG. 16, a $SiO_2$ film is deposited on the SiOCH film 15 to form a hardmask layer 16.

As mentioned above, the SiOCH film 15 having a high density is provided between the SiOCH film 14 and the $SiO_2$ film 16 so that damage to the SiOCH film 14 can be suppressed. Furthermore, with a dense layer covering the surface of the structure, adhesion to the upper layer (SiC layer) is improved, offering structural stability.

The density of the SiOCH film 14 is approximately 1.1 g/cc when the value k is 2.5. The SiOCH film 15 having the value k within the range of 2.7 to 3.0 is formed continuously on the SiOCH film 14. The density of the SiOCH film 15 is set to 1.3 to 1.4 g/cc.

The steps of FIGS. 17 to 20 that follow the above process are essentially the same as those of FIGS. 4 to 6 and 9; and therefore, the detailed explanations are omitted here.

FIG. 21 shows optical thickness measurement results of the dense layer (SiOCH film 15) that is deposited on the SiOCH film 14 with the semiconductor device manufacturing method according to the third embodiment of the present invention. This confirms the formation of the SiOCH film 15 having an average thickness of 10 nm.

According to the above structure and manufacturing method of a semiconductor device adopting a low-k film for an interlayer insulating film, damage to the low-k film is minimized during the formation of interconnect trenches, and formation of undercuts is suppressed so that defects in embedment of interconnect metal can be reduced.

As discussed above, with the semiconductor device and the manufacturing method thereof according to the first to third embodiments of the present invention, a semiconductor device incorporating an interlayer insulating film of a low relative dielectric constant can be offered, in which damage to the interlayer insulating film is reduced during the plasma treatment, and formation of undercuts is suppressed at removal of the damaged layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming an insulating film of a material having a low relative dielectric constant over a substrate;
    forming a SiOCH film on the insulating film in a chamber;
    forming a $SiO_2$ film continuously on the SiOCH film by reducing a carbon concentration therein in the chamber in which plasma is being generated;
    performing a plasma etching on the insulating film by using the SiOCH film and the $SiO_2$ film as a hardmask layer, to form a trench in the insulating film; and
    performing wet etching on a surface of the trench formed in the insulating film, to remove a layer damaged by the plasma etching and process residues.

2. The method according to claim 1, wherein an alkyl silane gas is adopted for a source gas of the hardmask layer.

3. The method according to claim 1, wherein the carbon concentration is gradually reduced by continuously increasing a flow rate of oxygen in the chamber.

4. The method according to claim 1, further comprising forming a conductive layer in the trench after the wet etching of the surface of the trench.

5. The method according to claim 1, wherein a relative dielectric constant of the SiOCH film is higher than a relative dielectric constant of the insulating film.

6. The method according to claim 1, wherein a relative dielectric constant of the insulating film is less than or equal to 3.0.

7. The method according to claim 1, wherein a thickness of the SiOCH film is less than a thickness of the $SiO_2$ film.

8. The method according to claim 1, wherein the insulating film is formed of SiOCH.

9. A method of manufacturing a semiconductor device, comprising:
    forming an SiOCH film on a substrate in a chamber;
    forming an $SiO_2$ film continuously on the SiOCH film by reducing a carbon concentration therein in the chamber in which plasma is being generated;
    performing a plasma etching on the SiOCH film by using the $SiO_2$ film as a hardmask layer, to form a trench in the SiOCH film; and
    performing wet etching on a surface of the trench formed in the SiOCH film, to remove a layer damaged by the plasma etching and process residues.

10. The method according to claim 9, wherein the carbon concentration is gradually reduced by continuously increasing a flow rate of oxygen in the chamber.

11. The method according to claim 9, further comprising forming a conductive layer in the trench after the wet etching of the surface of the trench.

12. The method according to claim 9, wherein a relative dielectric constant of the SiOCH film is less than or equal to 3.0.

13. A method of manufacturing a semiconductor device, comprising:
    forming an SiOCH film on a substrate;
    forming, on the SiOCH film, a dense layer having a density higher than a density of the SiOCH film and a carbon concentration higher than a carbon concentration of the SiOCH film;
    forming a hardmask layer on the dense layer;
    performing a plasma etching on the dense layer and the SiOCH film by using the hardmask layer as a mask to form a trench in the dense layer and the SiOCH film; and
    performing wet etching on a surface of the trench formed in the SiOCH film, to remove a layer damaged by the plasma etching and process residues.

14. The method according to claim 13, wherein a relative dielectric constant of the dense layer is higher than a relative dielectric constant of the SiOCH film.

15. The method according to claim 13, further comprising forming a conductive layer in the trench after the wet etching of the surface of the trench.

16. The method according to claim 13, wherein a relative dielectric constant of the SiOCH film is less than or equal to 3.0.

* * * * *